(12) United States Patent
Rosenbaum et al.

(10) Patent No.: US 6,587,989 B2
(45) Date of Patent: Jul. 1, 2003

(54) PCB/COMPLEX ELECTRONIC SUBSYSTEM MODEL

(75) Inventors: Alan Rosenbaum, San Jose, CA (US); Paul I. Rosenfeld, Mountain View, CA (US)

(73) Assignee: Ampro Computers, Inc., San Jose, CA (US)

( * ) Notice: Subject to any disclaimer, the term of this patent is extended or adjusted under 35 U.S.C. 154(b) by 0 days.

(21) Appl. No.: 09/953,530

(22) Filed: Sep. 14, 2001

(65) Prior Publication Data

US 2003/0056182 A1 Mar. 20, 2003

(51) Int. Cl.[7] .............................................. G06F 17/50
(52) U.S. Cl. ................... 716/1; 716/1; 716/10; 716/11
(58) Field of Search .............................. 716/1, 2, 4, 10, 716/11, 13, 17, 18; 364/490

(56) References Cited

U.S. PATENT DOCUMENTS

| | | | | |
|---|---|---|---|---|
| 5,331,572 A | * | 7/1994 | Takahashi | 716/11 |
| 5,499,192 A | | 3/1996 | Knapp et al. | |
| 5,666,288 A | * | 9/1997 | Jones et al. | 716/17 |
| 5,901,064 A | * | 5/1999 | Weber et al. | 364/490 |
| 6,260,177 B1 | | 7/2001 | Lee et al. | |
| 6,484,291 B1 | * | 11/2002 | Amiya et al. | 716/1 |
| 2001/0039642 A1 | * | 11/2001 | Takahiro | 716/10 |
| 2003/0009738 A1 | * | 1/2003 | Wadland et al. | 716/13 |

OTHER PUBLICATIONS

"Shortcut keys, The toolbar, The schematic page editor tool palette, The part editor tool palette," *Orcad Capture® Quick Reference*, pp. 1–8.
Cadence Design Systems, Inc., PCB Systems Division, "PCB Design Studio Cadence Technology, breakthrough price," *Cadence*, pp. 1–8.
Joel McGrath, "Chip/package co–design," Aug. 29, 2001, *Media for Advanced Packaging*, pp. 1–8.
"Cadence's Allegro Expert System," *Cadence datasheet*, pp. 1–10.
"Shortcut keys, CIS toolbars, Command mapping from CIS v7.20 to CIS Release 9," *Orcad® Component Information System Quick Reference*, pp. 1–5.
"Getting Started," *Orcad® Layout*, pp. 1–78.

* cited by examiner

Primary Examiner—Vuthe Siek
Assistant Examiner—Binh Tat
(74) Attorney, Agent, or Firm—Raymond E. Roberts; IPLO Intellectual Property Law Offices

(57) ABSTRACT

A process (100) and library element (14) product by that process for use with a design tool (18) to incorporate a complex electronic system (CES) (10) into a printed circuit board (PCB) (12) under development. The CES (10) is complex by virtue of having a plurality of connectors (20). The process (100) integrates physical data, and optionally also functional and other data, about the CES (10) into the library element (14). The library element (14) then may be stored and used from a conventional library (16) in the manner already widely used in the art for less complex elements.

19 Claims, 4 Drawing Sheets

Proposed Method

Existing Method

FIG. 2 (background art)

Proposed Method

| Physical | | Tool Provider | Part Provider | Part User |
|---|---|---|---|---|
| | CES | N (Y) | N (Y) | N |
| | Module | N | N | Y |
| | SoC | N | N | Y |
| | Basic Element | Y | Y | Y |
| Functional | | | | |
| | CES | N (Y) | N (Y) | N |
| | Module | N | N | Y |
| | SoC | N | N | Y |
| | Basic Element | Y | Y | Y |

Y   Yes, provided by this entity.
N   No, not provided by this entity.
(Y)   Not currently provided, but desirably so.

Table 1

PCB/COMPLEX ELECTRONIC SUBSYSTEM MODEL

TECHNICAL FIELD

The present invention relates generally to electrical data processing, and more particularly to systems for circuit design and analysis of modular components. It is anticipated that primary application of the present invention will be in the design of application specific electrical data processing systems.

BACKGROUND ART

Briefly, when laying out a printed circuit board (PCB) using a software tool, such as ALLEGRO, PADS, or OrCAD, each component needs to be modeled with a footprint and a definition of the component pins. However, when a subassembly, such as a daughter card, has needed to be part of the design, the associated connectors have had to be placed individually, and the physical constraints manually designed and checked. Not only can this be a long and tedious process, but it must be repeated for every new design using the same subassembly. Clearly this existing process is time consuming and repetitive, and each time it is repeated there is an opportunity for mistakes to be made.

PCB design is a complex subject, as a summary of conventional practice the following covers it at three levels. First, the general usual steps are stated, then these are individually discussed, and finally some key aspects from the first two levels are further discussed in detail.

A typical board design project includes the general steps of: creating the board, specifying parameters for it, placing and checking the component placements, routing and checking the routings, and finishing the board. Thus, at a top level, the complex topic of PCB design can be reduced to four steps.

To create the board a netlist is created from a schematic design using a capture tool. The netlist may particularly include design rules to guide the later logical placement and routing. To specify board parameters, global settings are provided for the board, including units of measurement, grids, and spacing. In addition, a board outline can be created and the layer stack, padstacks, and vias can be defined. To place components, and to check this, a component tool is used to manually place components on the board individually or in groups. The placements can then be checked using information from a variety of sources. To route the board, and to check this, a routing tool is used to manually route. Many such tools today include push-and-shove capabilities, which move tracks to make room for a track or tracks currently being routed. The routing can then also be checked using routing information from a variety of sources. To finish the board a layout tool is used, having an ordered progression of command options to use. For example, in OrCAD these commands include Design Rule Check, Cleanup Design, Rename Components, Back Annotate, Run Post Processor, and Create Reports. A layout tool may also include or interface with full-featured CAD and CAM tools.

Even at this second level, PCB design may not seem overly daunting. The problem, however, is the shear volume of data that must be managed, and the interrelationships between that data. It is this which has motivated the growth of a substantial industry providing software tools and even recent university text books on computer aided PCB design and fabrication.

A netlist file is used to describe the interconnections of a schematic design using the names of the nets, components, and pins. A netlist typically contains: footprint names; electrical packaging; component names; net names; the component pin for each net; and net, pin, and component property information.

A technology template may be used to specify the characteristics of a board, including manufacturing complexity and component type. Technology templates can also include the layer structure, grid settings, spacing instructions, and a variety of other board criteria.

A board template may also be used. This combines a board outline and possible mounting holes, edge connectors, and other physical board objects which may be merged with a layout tool's default technology template.

Finally, a board file is generated which contains all of the board's physical and electrical information. In view of the complexity of many PCB designs today, these files and templates may be quite large. In fact, the amount of data that software design tools can handle has become a major criteria for their selection and pricing, and the desired operation speeds and other capacity issues similarly have become criteria for selecting the hardware on which these software tools are run.

There are basically two ways to create a PCB, to start from scratch or to use a previously created template. In many tools one can also import information from CAD tool files, but this approach presumes that these files were once also created from scratch or based on templates, at some point. Thus, ultimately, somebody has to start from scratch.

After establishing a schematic as a starting point, when designing a new PCB, or a template to be used in, potentially, a number of PCB designs, the design process tends to next focus on components. Most PCB design tool sets today include a librarian tool, to handle component information, and these often come or can be configurably ordered with a large database of information on standard components. This component database is often termed a component information system (CIS) and it may contain information that is used at all levels of the design process. A typical CIS today includes logical and physical component data, as well as purchasing and manufacturing data.

The CIS or PCB library "content" is often modified considerably by the library users. PCB library users may add additional components to the library. This can be done often by buying new library content from the original tool provider, and "subscription" schemes for this are common. Component manufacturers are also a frequent source for new library content, particularly for non-standard components. Component distributors are also playing an increasing role here, supplying component library definitions for common software tools to their prospective customers, to facilitate the customers design with and hopeful purchase of the respective components. Lastly, the end users of PCB libraries may modify or add component definitions themselves. For instance, an engineer may change a component definition based on past experience with that component, say its noise or heat characteristics, or a purchasing agent may change order lead times based on past experience or a distributor's promise. A PCB library user may also add their own component definitions. For simple components this is widely done. For instance, a component such as a micro processor may be developed in-house or may be so new that its manufacturer has not yet standardized and shipped a library component definition.

PCB designers are comfortable with library component definitions, they have the qualities of basic building blocks, the available tools work well with them, and they tend to be well tested and reliable. Modern PCB designs, however, tend to quickly become more complex than simply picking and placing collections of basic component elements. Templates, macros, modules, and hierarchical design logic (HDL), are sub-tools which most sophisticated PCB design tools today include in at least some form, although with varying levels of acceptance and actual utility to the end users.

Templates are widely used. For example, if a designer is working on a PCB that will fit into a standard physical package, they can store the basic physical data for the board in a template file. If it is foreseeable that the next generations of the product will use, say, TTL ICs, the designer may go ahead and include a power supply and even clock circuits. If there are changes in future designs those will usually be minor in these areas. For very common PCBs, such as motherboards and daughter boards for personal computers, the PCB design tool provider may even supply very basic standard templates. Thus, PCB designers are often relatively comfortable with templates.

PCB designers, however, tend to not be comfortable with macros and modules. Macros here are much like macros in other common software tools, they are constructs of data and operational instructions. A macro may be a recording of user entered data and operations, or it may be written from scratch in a high-level macro programming language. Recorded macros often are rendered into a high-level macro programming language so that they can be edited and modified. Written macros usually need to be tested and edited. Both recorded and written macros, however, tend to suffer from two extremes, attempting to cover too little or too much at once.

A macro that is recorded is necessarily based on the state of the environment in which it is being recorded, and that environment may be quite complex. Attempting to provide for all later eventualities can make the macro unduly large and slow, and inherently degrades into an automated form of macro writing, anyway. In contrast, when a human writes a macro they tend to include too little because they are narrowly focused and have only a limited grasp of all of the variables and options available. For an example by way of analogy, the widely used word processing software being used here includes macro recording and writing capability. A simple task can be recorded and produce a 50-line macro, or it may be written as a 5-line macro. Both versions may work fine if the word processor is used in a "what you see is what you get" display mode, but one the other or both versions may produce undesired results or simply crash if the word processor is used in a draft text mode. In common word processing this may be acceptable, because human mechanisms catch or tend to forgive the resulting errors, but in complex PCB design the risks and the costs of the consequences are just too high.

Before closing on the topic of macros, it should be noted who generally has to provide macros. A tool designer may include example macros, but for frequent tasks they simply add a feature to their product.

In contrast to the complexity of macros, modules are simple. They are aggregates of their contents. HDL provides a good context in which to explain modules. In a PCB design a digital signal processor (DSP) block may be provided to gather data, along with a communications block, a power supply block, and a clock block. An HDL based design may thus start with these four basic blocks, perhaps by putting them into a standardized template. Some of these blocks are good candidates for modularization. A standard power supply block may be used, and a standard clock block may provide at least a starting point. Even the communications block may be standardized, thus leaving the only difficult design in the DSP block. Simply quartering the board and relegating the respective blocks to these quarters is usually too simplistic, however. The modules as aggregates of their contents instead get, conceptually, dropped into the board design and then get manipulated by pulling or pushing connection traces, or orienting or separating components, etc. A module thus is not desirably treated as a simple black box.

Nonetheless, there may be subassemblies which it is highly desirable to treat as a black box in PCB design. One increasingly common example is a standardized processor subsystem that is to be used in an application specific logic board. The present inventors, as representatives of Ampro Computers Inc., a leading supplier of standards-based computing solutions for embedded applications, have been faced with the growing customer need to easily design products using Ampro's EnCore line of processor subsystems. [Further details of the EnCore product and supplemental background information may be found in applicant's co pending U.S. patent application Ser. No. 09/917,481, hereby incorporated by reference.]

Figure 1A:
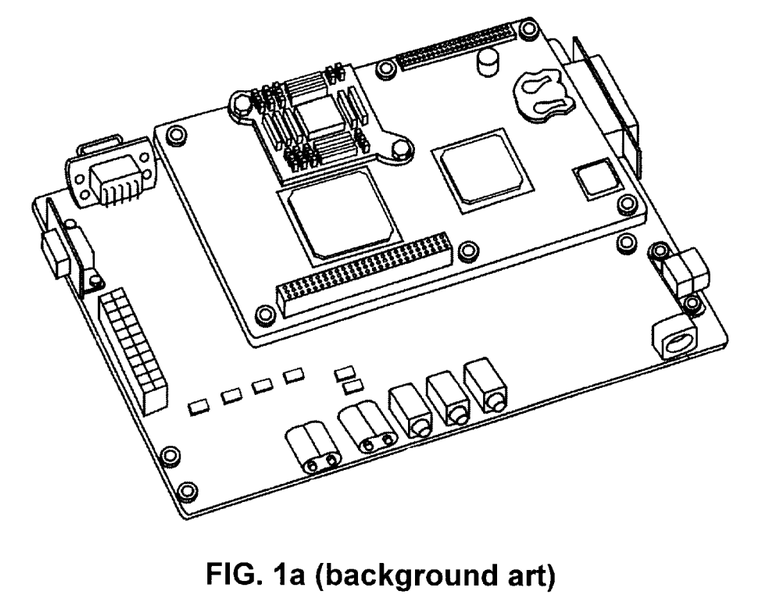
FIGS. 1a–b (background art) show an example complex electronic system (CES), with FIG. 1a showing it installed into a printed circuit board (PCB) and FIG. 1b showing just its footprint and connector layout.
Figure 1B:
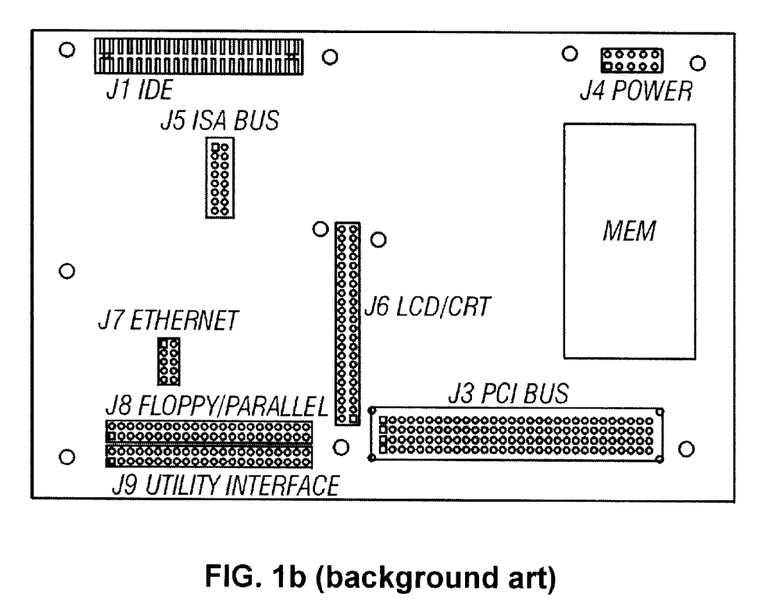

The EnCore systems are daughter boards specifically intended for use with application specific logic boards, where the use of an EnCore unit can abstract out the burdensome design and testing of core processor and I/O subsystems. FIGS. 1a–b (background art) show an EnCore system, with FIG. 1a showing it installed into a PCB and FIG. 1b showing just the footprint and connector layout of the EnCore system. In many design scenarios the physical details, such as the footprint and connector layout will be all that is needed. However, in more complex design environments, additional information, like electrical constraints can also be used.

The EnCore systems are thus examples in the growing class of complex electronic systems (CESs) which it is highly desirable to be able to easily incorporate into larger electronic systems. PCB designers do not want to be unduly burdened with the unnecessary internal details of CESs, and they particularly do not want their PCB design tools unduly burdened by these.

Unfortunately, in the present PCB design scheme, PCB design tools do not well work with CESs. Describing a CES with a macro is a massive undertaking and one fraught with peril. Even if a software PCB design tool and its underlying hardware can handle such a macro, the chances or recording or writing such macros that will be reliable is small. Similarly, a module approach, as we have described it herein, is too complex and risky. Both of these approaches include too much detail, which burdens the tools being used.

Figure 2:
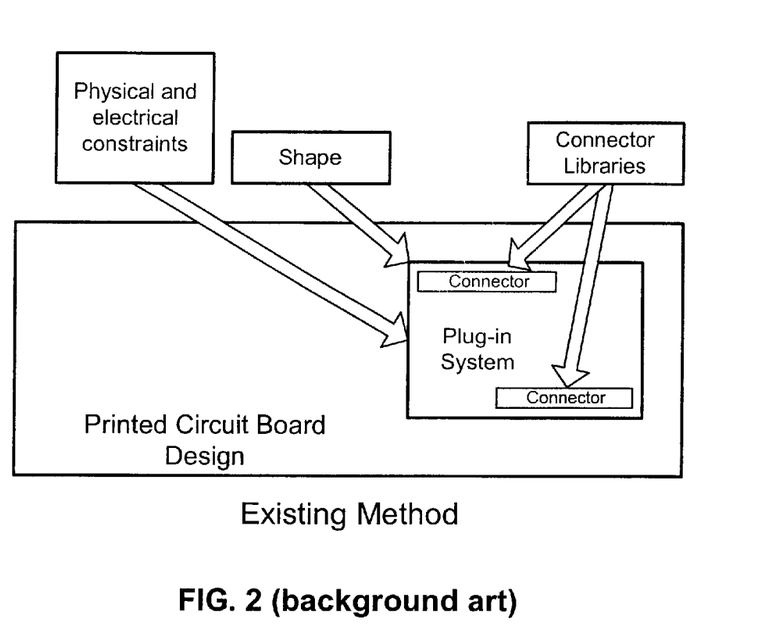
FIG. 2 (background art) is a block diagram depicting how the existing methods require access to several libraries to place a subassembly such as a CES on a PCB in design.

FIG. 2 (background art) is a block diagram depicting how the existing methods require access to several libraries to place a subassembly on a PCB. Each library must be validated for correctness, and the designers merely using CESs may well not have or want to have detailed information on the components of the CESs. The designers are also burdened even if they have the library information, since each part of the CES subassembly must be individually placed into the larger PCB design. For instance, where the vias are in a CES is irrelevant to the larger task of designing a PCB that the CES will plug into. Similarly, the possibility of traces on the CES being pushed or the connector for it being reoriented or shifted even a minor distance is unacceptable.

Accordingly, what is needed is a new approach to handling the growing use of CESs. The present inventors have analyzed this need and feel that the use of macro and module approaches are not suitable, if for no other reason than that user already distrust these and will not readily accept improvements of these tried and failed approaches. Rather, the inventors have concluded that a library element approach will best serve the need here. PCB designers are necessarily, already familiar with the use of library elements. It follows that what is needed is a library element approach that includes complex electronic systems (CESs).

DISCLOSURE OF INVENTION

Accordingly, it is an object of the present invention to provide an improved system to incorporate a complex electronic system (CES) in to a printed circuit board (PCB) design.

Briefly, a first preferred embodiment of the present invention is a method for creating a library element for a complex electronic system (CES) for use in a software printed circuit board (PCB) design tool. A specification for the CES is defined. Pads for the electrical connections of the CES are then specified according to the specification, connectors for groupings of the pads of the CES are also specified according to the specification, and a footprint of the CES is specified according to the specification. The presence of at least two said connectors define the CES as being complex. The pads, connectors, and footprint are then integrated into a single element unit, and this is stored as a library element for later distribution and use.

Briefly, a second preferred embodiment of the present invention is a library element as a product made by the method of the first preferred embodiment.

An advantage of the present invention is that it does provide an improved system to incorporate a complex electronic system (CES) in to a printed circuit board (PCB) design, and it does this in highly efficient and easily adoptable manner.

Another advantage of the invention is that it permits the use of a library element for one or more CESs when designing PCBs. As such, as little as one library is needed, and that library need not contain data on the respective individual elements of the CES.

Another advantage of the invention is that its use of a library element approach to PCB design is less burdensome on the software and hardware resources used. The software design tools are not unduly burdened by the processing efforts of a macro approach or the excessive detail of a modular approach. The hardware is not unduly burdened by the need to store and manage large and multiple CIS or library databases, and additional processing is minimized. As is well known, an increase in element count produces an increase in processing which is quite non-linear. The other design as-if-with-separate-elements, macro, and modular approaches all require treatment of a CES essentially as all of its individual elements. The invention reduces it to a single library element.

Another advantage of the invention is that it also works well with the human resources used in PCB design. It employs existing user knowledge and skills, since users doing PCB design necessarily must be familiar with more basic library elements, and it benefits from the existing user confidence with library elements. Unlike the other possible approaches to using CESs, the human user is not unduly burdened when using the same or similar CESs in multiple PCB designs. The users do not have to themselves work with each element of the CES, repetitively in each project, and they do not have to work with slowed and over burdened tools.

And another advantage of the invention is that it will reduce the costs of CES use and adoption in PCB design. The invention promotes direct efficiency in its use, and it also promotes project and distribution efficiency. Individual users may employ the invention quickly and accurately. Companies may employ the invention across a plurality of projects and project generations, and derive economies of scale. And the industry may employ the invention to easily and rapidly speed the acceptance and use of CESs in larger PCB designs. The invention thus provides substantial cost benefits.

These and other objects and advantages of the present invention will become clear to those skilled in the art in view of the description of the best presently known mode of carrying out the invention and the industrial applicability of the preferred embodiment as described herein and as illustrated in the several figures of the drawings.

BRIEF DESCRIPTION OF THE DRAWINGS

The purposes and advantages of the present invention will be apparent from the following detailed description in conjunction with the appended figures and table of drawings in which:

FIG. 3 is a block diagram depicting in a stylized manner how the present invention permits a CES to be designed into PCB work piece in a greater design scheme.

TABLE 1 depicts the current and the desired schemes for library element distribution, both for element physical and functional attributes.

In the various figures of the drawings, like references are used to denote like or similar elements or steps.

Best Mode For Carrying Out The Invention

A preferred embodiment of the present invention is library element model of a complex electronic system (CES) for use in a printed circuit board (PCB). As illustrated in the various drawings herein, and particularly in the views of FIGS. 3–4, preferred embodiments of the invention are depicted by the general reference characters 14, 100.

Figure 3:
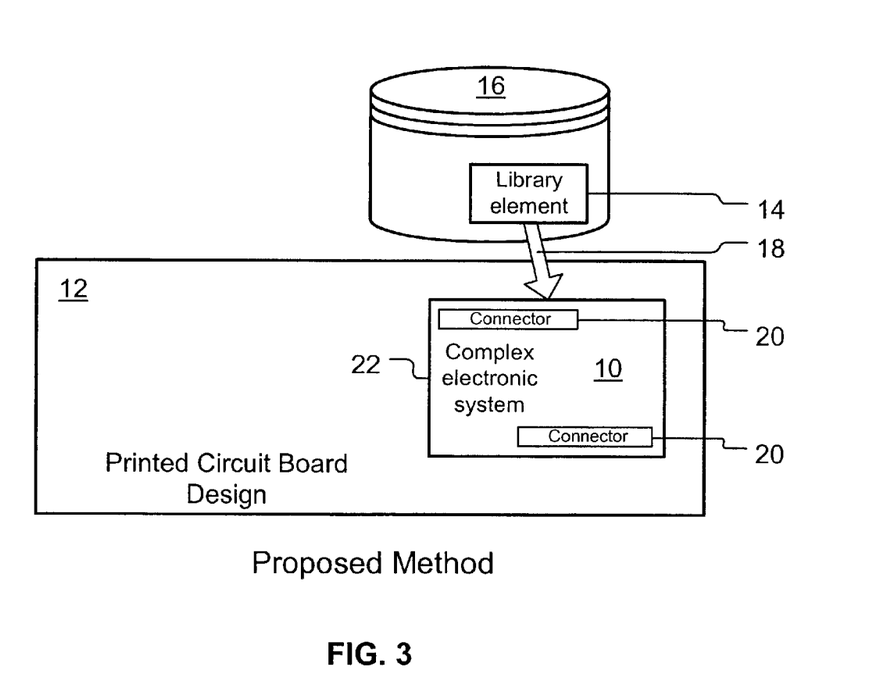
FIG. 3 is a block diagram depicting how the present invention permits a library element to place a complex electronic system (CES) on a PCB, and thus only access to a single library.

FIG. 3 is a block diagram depicting in a stylized manner how the present invention permits a complex electronic system (CES 10) to be designed into a PCB 12, i.e., a work piece in the greater design scheme here. The CES 10 is represented as a library element 14, which may reside in and thus only require access to a single library 16 by a design tool 18. The CES 10, the library 16, and the design tool 18 may be essentially conventional. The CES 10 attaches to the PCB 12 by a plurality of connectors 20 (including a plurality of pads, not shown). The CES 10 also exhibits a footprint 22 with respect to the PCB 12, which is simply rectangle here.

For purposes of this discussion, a complex electronic system (CES) is an electronic system consisting of a plurality of components and having at least two connectors for connection with a larger electronic system, e.g., a PCB. Basic components such as resistors, connectors, and integrated circuit are not complex electronic systems. Note, while arguably being complex, some industry standard devices like dual in-line memory modules (DIMMs) and systems on a chip (SoCs) fall outside of this definition. A DIMM or SoC has only a single connector, and a SoC is a single component. These devices may be complex in many regards, but they are not so for the purpose of PCB design, as their use generally degrades to a simple exercise of single, standard-type connector placement. An example of a CES is the EnCore system, discussed in the Background Art section and shown in FIGS. 1*a–b* (background art).

A library element is a standardized model of an electronic device or system, for use by a generally conventional PCB development tool. Library elements are typically created by the device manufacturer for ultimate distribution to users of PCB development tools, for incorporation into the libraries they use with these tools. The phrase "part definition" has deliberately been eschewed here as being too restrictive. The traditional concept of a part does not reconcile with devices greater than a single, simple device like an integrated circuit. The embodiment of the device model here is "standardized" by virtue of creation for use by others, and particularly by reusability.

TABLE 1 depicts the current and desired scheme for library element distribution, both for element physical and functional attributes. At present, designers, that is the part users, must design CESs directly into their projects. Theoretically the designers can also use a macro or modular design approach, as discussed in the Background Art section. The present inventors do not know of anybody actually doing this with CESs as complex as the EnCore systems, for example. It may strike the reader that the "Part User" should also be able to create their own library elements for CESs. That is quite possible using the present invention, but it is not desirable. The "Part Provider" is logically the entity best suited for creating CES library elements, and the "Tool Provider" is logically the entity best suited for distributing the CES library elements, either initially with their products or by upgrade or subscription schemes. Of course, a logical best approach sometimes is not followed or takes time to be accepted. A "Part Provider" might well sub-contract out CES library element development, and a "Tool Provider" may hesitate to add CES library elements to their offerings until they see a growing demand for this.

Figure 4:
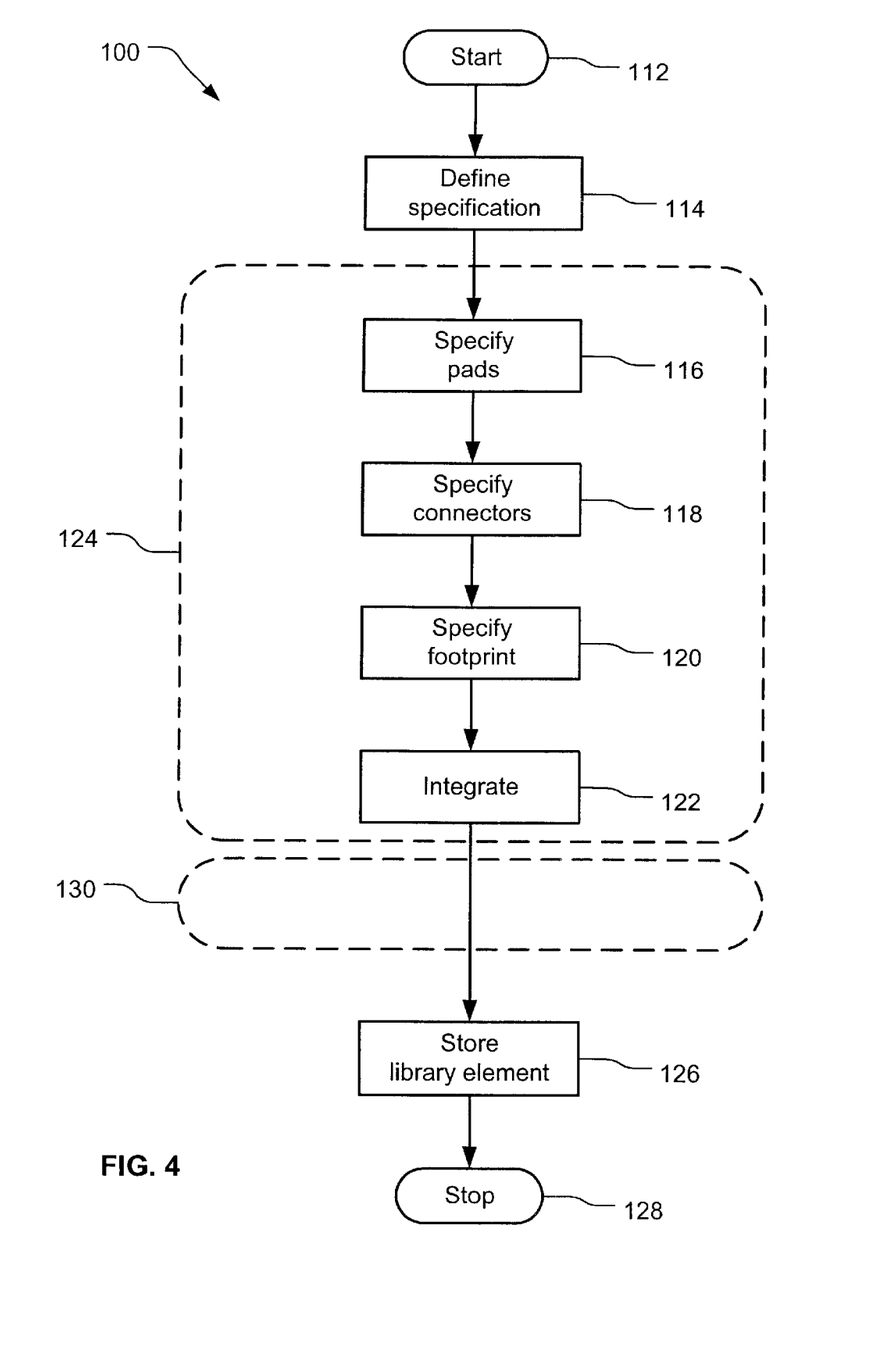
FIG. 4 is a flow chart depicting a process according to the present invention which is suitable for creating a library element according to the present invention, to represent a CES for use in designing a PCB, such as that of FIG. 3.

FIG. 4 is a flow chart depicting a process 100 according to the present invention which is suitable for creating a library element 14 to represent a CES 10 for use in designing a PCB 12, such as that of FIG. 3. The process begins with an initial step 112, where any desired set-up operations can be handled. In a step 114 a specification for the CES 10 is defined. In a step 116 the pads for the CES 10 are specified according to the specification defined in step 114. In a step 118 the connectors 20 for the CES 10 are specified according to the specification defined in step 114. Typically these will encompass all of the pads of step 116. Note, there will be multiple connectors 20 for the CES 10, by definition.

In a step 120 the footprint 22 for the CES 10 is specified according to the specification defined in step 114. This step 120 could, of course, be performed earlier, even before step 116. Performing it here is a matter of choice, but one largely motivated by the pragmatic fact that the locations of the pads and connectors 20 are almost always critical, and this is less often the case for the footprint 22 of the CES 10.

In a step 122 the information of steps 116–120, that is for the pads, connectors, and footprint, is integrated into a single model for the CES 10. Conceptually, steps 116–122 are a mega-step 124, with the purpose of obtaining this single model for the CES 10. In a step 126 this model is stored, as the yet to be distributed library element 14. A step 128 then completes the process 100, where any wrap up operations can be performed.

The above discussion of the process 100 might somewhat imply that the CES 10 is being developed from scratch, but that need not be the case and often it will not be. The manufacturers of CESs 10 will typically themselves have used PCB development tools. The products of these tools can provide inputs to the process 100. For example, the complete PCB design for the CES 10 may be used in step 114 as the specification of the CES 10 there. The subsequent steps 116–122 then reduce largely to redacting out unnecessary information.

Specifying the pads for electrical connection of the CES 10 with the PCB 12 will typically require considerably less data than is needed to define the pads internally to the CES 10. For instance, within groups of pads, the number and which will be pad one are key details; while the spacing around the pads on the PCB of the CES 10 is not important for the library element 14.

Specifying the connectors 20 for electrical connection of the CES 10 with the PCB 12 will similarly require less data, and in step 116 unnecessary information can similarly be redacted out. For instance, the metallic composition of the pins, the purchase lead time, etc. for the connectors are irrelevant here.

Specifying the footprint 22 in step 118 may similarly be an exercise in redaction. The integration in step 122 then may reduce to just that, integrating only the products of steps 116–120, and effectively dispensing with the typically large body of other information in the PCB design for the CES 10 which is being used in step 114. For instance, ground plane and layer information for the CES 10 is also irrelevant here.

The process 100 may also include an optional mega-step 130. If it is desired that the library element 14 include functional and other information specification steps, this is where these can be added. Initially, users of the CES 10 can be expected to welcome library elements 14 having just physical information, but once they appreciate the usefulness of those they can be expected to rapidly also want library elements 14 that include all of the same capabilities as library elements for even the most basic of components. For instance, electronic noise, temperature, voltage ranges, and others types of functional data can be included in library elements 14, just as it commonly is now for, say, integrated circuit (IC) devices. Pricing cusp points, delivery lead times, etc. can also be included for widely used "commodity" type CESs 10, say, like the EnCore 500 processor and I/O system by Ampro Computers Inc., of San Jose, Calif.

Thus, while various embodiments have been described above, it should be understood that they have been presented by way of example only, and not limitation. The breadth and scope of the invention should not be limited by any of the above described exemplary embodiments, but should instead be defined only in accordance with the following claims and their equivalents.

Industrial Applicability

The present inventive process 100 and the inventive library element 14, as a product by the process, are well suited for application in designing printed circuit boards (PCBs) which need to include one or more complex electronic systems (CESs). As summarized in TABLE 1, the ability to use a library element for this increasingly common design task has not heretofore been possible. Rather, what has previously existed has been designing as-if-with-separate-components, and a very limited amount of use of macro and modular approaches.

In fact, a substantial impetus to the inventors in developing the present invention has been customer requests for the inventor's design files for CES products, for these customers to try to use in a modular approach to their own PCB designs. As employees of a major manufacturer of CESs, Ampro Computers Inc., of San Jose, Calif., the inventors then came to appreciate that those customer requests define a substantial and rapidly growing need, but not the best solution for that need. While some customers use the same PCB design tools and generations of those tools as Ampro does, this is not the universal case. Furthermore, as Ampro's products tend to be at the very forefront of complexity in available CESs today, the ability of the software tools and the hardware running these tools would be severely tested by treating a CES as a modular aggregate of its parts. That is even if these customers are given Ampro's proprietary internal design files, it is doubtful that they could actually make much use of them in their projects. Thus, the library element approach was conceived and evolved at Ampro.

The method of using only one library element to define a basic electronic component has long been known and accepted, and it is quite reasonable to expect similar adoption for library elements for CESs. The existing knowledge and confidence bases of the designer-user community can be leveraged and the use of such a library element approach is minimally burdensome on the software and hardware resources commonly used in the general field of PCB design. Additionally, and in particular, as a variety of software tools from different companies and not all following similar standards are already in wide use, the use of a library element approach is the most efficient way to implement for a plurality of such tools.

A library element also requires considerably less information than a modular approach, and unnecessary conversion and cross checking of such conversion is thereby avoided. Similarly, as a library element does not directly embody functionality, so it is much more easily implementable in a plurality of design environments that a macro approach can be.

It follows that PCB design will directly benefit in a number of regards. For example, PCBs using CESs can be designed faster. The inventors have found that a PCB design test project that took over a week previously now takes only two days. The inventors have also observed that fewer errors are introduced by using the inventive library element approach. In another test situation the use of conventional PCB design methods resulted in a connector being offset one pin-width, whereas use of the invention would have avoided this simple, currently all too common, and potentially very expensive error.

Some of the other potential benefits of the invention are not as immediately apparent, but are also likely to be quite important and to motivate wide and rapid acceptance of the invention. For instance, repetitive design can be eliminated. The rules used for CESs do not have to be defined repeatedly for use of a common or similar CES in each new PCB design. Since the details for most of the CES components can effectively be abstracted out of the PCB design process, the component library files can be fewer, smaller, and more easily maintained. Of course, still other benefits of the invention can be expected to emerge as its use grows and as it gets applied to a wider range of applications.

For the above, and other, reasons, it is expected that the process and the products by the process of the present invention will have widespread industrial applicability. Therefore, it is expected that the commercial utility of the present invention will be extensive and long lasting.

What is claimed is:

1. A method for creating a library element for a complex electronic system (CES) for use in a software printed circuit board (PCB) design tool, the method comprising the steps of:
   (a) defining a specification for the CES;
   (b) specifying pads for electrical connection for the CES according to said specification;
   (c) specifying connectors for groupings of said pads according to said specification, wherein at least two said connectors define the CES as being complex;
   (d) specifying a footprint for the CES according to said specification;
   (e) integrating said pads, connectors, and footprint into a single element unit; and
   (f) storing said element unit as a library element.

2. The method of claim 1, wherein said step (a) includes incorporating into said specification for the CES at least part of an existing specification of the CES used in its design.

3. The method of claim 2, wherein at least one of said steps (b)–(c) includes redacting out information not germane to at least one of said pads, said connectors, and said footprint from said specification of the CES to arrive at said specification for the CES.

4. The method of claim 1, wherein:
   said step (a) includes taking an existing specification of the CES used in its design; and
   said steps (b)–(c) include redacting out information not germane to said pads, said connectors, and said footprint from said specification of the CES to arrive at said specification for the CES.

5. The method of claim 1, further comprising:
   (g) specifying at least one functional characteristic of the CES.

6. The method of claim 5, wherein said step (g) is included in said step (a).

7. The method of claim 5, wherein said step (g) occurs after said step (e), and the method further comprising:
   (h) integrating said at least one functional characteristic of the CES into said element unit, thereby defining the CES at a physical level and also a functional level and permitting selective physical or functional design use of the library element.

8. The method of claim 5, wherein a said functional characteristic includes at least one member of the set consisting of electronic signal characteristics, electro-magnetic noise characteristics, and thermal characteristics of the CES.

9. The method of claim 5, wherein a said functional characteristic relates to at least one member of the set consisting of procurement characteristics and manufacturing handling characteristics of the CES.

10. A library element made by the method of claim 1, wherein the library element is embodied on a computer readable storage medium.

11. A library element made by the method of claim 7, wherein the library element is embodied on a computer readable storage medium.

12. A library element for a complex electronic system (CES) for use in a software printed circuit board (PCB) design tool, the library element embodied on a computer readable storage medium and comprising:

(a) a code segment that defines a specification for the CES;

(b) a code segment that specifies pads for the electrical connections of the CES according to said specification;

(c) a code segment that specifies connectors for groupings of said pads of the CES according to said specification, wherein at least two said connectors define the CES as being complex;

(d) a code segment that specifies a footprint of the CES according to said specification;

(e) a code segment that integrates said pads, connectors, and footprint into a single element unit; and (f) a code segment that stores said element unit as a library element.

13. The library element of claim 12, wherein said code segment (a) includes a code segment for incorporating into said specification for the CES at least part of an existing specification of the CES used in its design.

14. The library element of claim 12, wherein:

said code segment (a) includes a code segment for taking an existing specification of the CES used in its design; and at least on of said code segments (b)–(c) include a code segment for redacting out information not germane to said pads, said connectors, and said footprint from said specification of the CES to arrive at said specification for the CES.

15. The library element of claim 12, further comprising:

(g) a code segment that specifies at least one functional characteristic of the CES.

16. The library element of claim 15, wherein said code segment (g) is included in said code segment (a).

17. The library element of claim 15, further comprising:

(h) a code segment that integrates said at least one functional characteristic of the CES into said element unit, thereby defining the CES at a physical level and also a functional level and permitting selective physical or functional design use of the library element.

18. The library element of claim 15, wherein a said functional characteristic includes at least one member of the set consisting of electronic signal characteristics, electromagnetic noise characteristics, and thermal characteristics of the CES.

19. The library element of claim 15, wherein a said functional characteristic relates to at least one member of the set consisting of procurement characteristics and manufacturing handling characteristics of the CES.

* * * * *